United States Patent
Donohue (10) Patent No.: US 7,129,161 B2
(45) Date of Patent: Oct. 31, 2006

(54) DEPOSITING A TANTALUM FILM (75) Inventor: Hilke Donohue, St. Nicholas (GB)

(73) Assignee: Trikon Holdings Limited, Newport (GB)

( * ) Notice: Subject to any disclaimer, the term of this patent is extended or adjusted under 35 U.S.C. 154(b) by 94 days.

(21) Appl. No.: 10/483,805

(22) PCT Filed: Jul. 15, 2002

(86) PCT No.: PCT/GB02/03238

§ 371 (c)(1),
(2), (4) Date: Sep. 15, 2004

(87) PCT Pub. No.: WO03/008660

PCT Pub. Date: Jan. 30, 2003

(65) Prior Publication Data

US 2005/0048775 A1     Mar. 3, 2005

(30) Foreign Application Priority Data

| Jul. 19, 2001 | (GB) | ................................. 0117599.1 |
| Jan. 24, 2002 | (GB) | ................................. 0201590.7 |
| Mar. 15, 2002 | (GB) | ................................. 0206116.6 |

(51) Int. Cl.
H01L 21/4763   (2006.01)

(52) U.S. Cl. ................ 438/627; 257/E21.584

(58) Field of Classification Search .................. 438/627
See application file for complete search history.

(56) References Cited

U.S. PATENT DOCUMENTS

| 3,878,079 | A | 4/1975 | Schauer |
| 4,305,998 | A | 12/1981 | Manty et al. |
| 5,221,449 | A | 6/1993 | Colgan et al. |
| 5,281,485 | A | 1/1994 | Colgan et al. |
| 5,882,498 | A | 3/1999 | Dubin et al. |
| 6,146,517 | A | 11/2000 | Hoinkis |
| 6,194,307 | B1 | 2/2001 | Chen et al. |
| 6,221,758 | B1 | 4/2001 | Liu et al. |
| 6,277,728 | B1 | 8/2001 | Ahn et al. |
| 6,342,448 | B1 | 1/2002 | Lin et al. |
| 2001/0006224 | A1 | 7/2001 | Tsuchiya et al. |
| 2002/0046874 | A1* | 4/2002 | Cabral et al. ............ 174/137 R |

FOREIGN PATENT DOCUMENTS

| EP | 0 388 888 A2 | 9/1990 |
| EP | 0881 673 A2 | 12/1998 |
| EP | 1 033 745 A2 | 6/2000 |
| EP | 1 123 988 A1 | 8/2001 |
| WO | WO 99/63593 | 12/1999 |
| WO | WO 00/17414 | 3/2000 |
| WO | WO 01/01472 A1 | 1/2001 |
| WO | WO 01/17026 A1 | 3/2001 |

OTHER PUBLICATIONS

Kim et al., Chemical Interaction and Adhesion Characteristics at the interface of metals (Cu, Ta) and low—K Cyclohexane—Based Plasma Polymer (ChexPP) Films, J. Vac. Sci. Technol. A 19 (4), p. 1072-1077 (2001).*

(Continued)

Primary Examiner—Asok Kumar Sarkar
(74) Attorney, Agent, or Firm—Volentine Francos & Whitt, PLLC (57) ABSTRACT This invention relates to a method of depositing a tantalum film in which α-Ta dominates and to methods of electroplating copper using such films. The films have a thickness of less than 300 nm and are formed by depositing a seed layer of an organic containing low dielectric constant insulating layer and sputtering tantalum onto the seed layer at a temperature below 250° C.

12 Claims, 6 Drawing Sheets

OTHER PUBLICATIONS

Hilke Donohue et al., "Low-resistivity PVD Tantalum: Phase formation and Integration in ultra-low k dielectric/ Copper damascene structures".

Momtchil Stavrev et al., "Behavior of thin Ta-based films in the Cu/barrier/SI system," J.ac. Sci. Technol. A 17(e), May/Jun. 1999, pp. 993-1001.

* cited by examiner

Deposition method and substrate type vs. Ta phase and resistivity value

| Deposition Method | Wafer outgas time and temp. | Dep T.°C | Substrate | Ta phase | Resis. µΩ cm |
|---|---|---|---|---|---|
| AHF + bias | none | 50 | Thermal Oxide | beta | 210 |
| AHF + bias | none | 50 | ULK + crust | beta | 195 |
| AHF + bias | none | 50 | ULK, no crust | alpha | 25 |
| AHF + bias | 30min, 200°C | 200 | Thermal Oxide | beta | 195 |
| AHF + bias | 30min, 200°C | 200 | ULK with crust | alpha | 21 |
| AHF + bias | 30min, 200°C | 200 | ULK, no crust | alpha | 27 |
| AHF + bias | 5min, 200°C | 200 | Thermal Oxide | beta | 210 |
| AHF + bias | 5min, 200°C | 200 | ULK with crust | alpha | 21 |
| AHF + bias | 5min, 200°C | 200 | ULK, no crust | alpha | 26 |
| HF | 5min, 200°C | 200 | Thermal Oxide | beta | 200 |
| HF | 5min, 200°C | 200 | ULK with crust | beta | 201 |
| HF | 5min, 200°C | 200 | ULK, no crust | alpha + beta | 46 |
| HF + bias | 5min, 200°C | 200 | Thermal Oxide | beta | 194 |
| HF + bias | 5min, 200°C | 200 | ULK with crust | beta | 193 |
| HF + bias | 5min, 200°C | 200 | ULK, no crust | alpha + beta | 32 |

DEPOSITING A TANTALUM FILM

This, invention relates to a method of depositing Ta film in which α-Ta dominates and methods of electroplating copper utilising tantalum films.

Sputter deposition of Tantalum thin films onto insulators in an inert gas atmosphere generally leads to the formation of β-Ta. This phase, which possesses a tetragonal structure, is the high-resistivity Ta phase, with a value in the range of 180–220 μΩcm.

A second phase is α-Ta, with a bcc structure and a much lower resistivity of approximately 20–50 μΩcm. Thirdly, a mixture of both phases can be found in Ta thin films with resistivity values between those of the pure phases.

The low resistivity of α-Ta makes it the favourable candidate over β-Ta for numerous applications in the electronics industry. Although α-Ta is the thermodynamic stable phase in the bulk metal, it is very difficult to reproducibly generate the low-resistivity phase in sputtered thin films with a typical thickness of up to 300 nm. Here, the high resistivity β-phase dominates.

There are three methodologies known to the prior art that may be employed to produce pure α-Ta thin films by sputtering.

Firstly, a substrate temperature exceeding 600° C. can lead to the formation of α-Ta. This approach however is of little practical use for electronics applications, where substrate temperatures often have to be minimised to avoid damage to temperature sensitive materials.

The second method involves the introduction of gaseous impurities/foreign atoms into the Ta lattice during the sputter processes or in an additional post-deposition plasma treatment. These impurities include nitrogen, hydrogen or oxygen. However, the change in resistivity with the amount of gaseous impurities can be very rapid and control is generally difficult.

The third and most recent approach is the introduction of an additional base layer, which acts as a 'seed' for the formation of the low-resistivity α-phase in the subsequently deposited Ta film. These base layers include TaN, Nb, or W.

These methods are either impractical or involve the, introduction of an additional process step/material. Furthermore, the addition of a second layer in the last case might considerably increase the resistivity of the complete layer stack (base layer and Ta).

Tantalum is of particular interest in a copper metallisation in a submicron damascene structure for microelectronic applications. Typically there is a barrier layer consisting of firstly tantalum and then tantalum nitride, followed by a seed layer of copper. This is then plated to fill the damascene structure with copper. The tantalum is primarily an adhesion layer. There is therefore a need for a low temperature method for forming alpha phase tantalum.

WO-A-00/17414 describes depositing low resistivity tantalum and tantalum nitride layers at an elevated substrate temperature of about 325° C. to about 550° C. In particular on page 14 of that disclosure a tantalum film of low resistivity was deposited at a substrate platen temperature of 400° C. that is said to equate to a substrate temperature of 325° C. to 350° C. or higher. Tantalum deposited at lower temperatures is shown to be of high resistivity and to have been converted by a subsequent anneal of about 400° C. or higher to a low resistivity film. Therefore this disclosure shows the creation of low resistivity tantalum only when the wafer is subject to the application of 400° C.

Whilst it is stated that low resistivity tantalum is alpha phase, nowhere does this disclosure describe what the surface of the substrate consists of upon which the tantalum and tantalum nitride is formed, nor the thickness of the tantalum films deposited. It is already well known that the receiving surface and film thickness are important considerations in the formation of alpha tantalum films.

We will also show later that higher resistivity tantalum does not necessarily mean the loss of the alpha phase of tantalum as is implied in this disclosure.

Turning to the question of temperature, as the relevant criteria is thermal budget, there is little practical advantage in depositing at room temperature and then subsequently annealing at a higher temperature, over depositing at that higher temperature in the first place.

The present invention relates to a method of depositing Ta film in which α-Ta dominates having a thickness <300 nm and more particularly less than 30 nm (300 Å) comprising depositing a seed layer of an organic containing low dielectric constant insulating layer and sputtering tantalum onto the seed layer at a temperature below 600° C.

Preferably the temperature is below 250° C. and a temperature ceiling of 100° C. is particularly preferred.

Preferably the seed layer is a carbon doped hydrogenated silicon dioxide e.g. methyl-doped silicon oxide and particularly conveniently it may be a film deposited in accordance with the teaching of WO 01/01472, which is in the name of the same applicants, the teaching of which is hereby incorporated. Thus the seed layer may be formed by reacting a silicon-containing organic compound or compounds and oxidising agent(s) in the presence of a plasma and setting the resultant films such that the carbon-containing groups are contained therein. The film may be set by exposing it to a hydrogen-containing plasma.

In a particularly preferred embodiment, the surface of the seed layer has been etched away prior to sputtering. Additionally or alternatively, the sputtered material may arrive at the surface of the seed layer with higher energy e.g. by the application of substrate bias and/or ionised sputtering. Long throw sputtering with a target to substrate spacing of at least 200 mm and preferably >240 mm is preferred. The material described as the seed layer is in fact a very effective low k dielectric material and therefore may already exist in, for example, a semi-conductor device during its manufacture. In that case the layer would function both as the low k layer and the effective seed layer for the Ta, particularly after a surface crust layer is removed e.g. of 10–50 nm e.g. by a plasma etch, of $C_3F_8$ for 30 seconds. Such surface layers may not be representative of the bulk seed layer either structurally and/or chemically.

It has been found by the Applicants that these films are particularly suitable for using on profiled surfaces such as the profiled surface of a semiconductor wafer during the manufacture of semiconductor chips, for example using the dual damascene process.

The trend is to use copper in such processes and to deposit it by electroplating. To achieve a good and uniform plating process it is preferable that the conductive layer on which the copper is to be electroplated, has a low and preferable uniform electrical resistance. This is because electrical contact with the front side of the wafer is made via clips at the edge of the wafer. As wafer sizes are now up to 300 mm and the front side of the wafer is profiled with recesses, the electrical resistance across the wafer would otherwise be variable and sufficiently large as to cause plated thickness non-uniformity.

Typical tantalum barriers are of high resistivity as they are generally of beta phase tantalum. This phase has a resistivity of typically around 170~200 micro.ohm.cm. Accordingly, to achieve good electroplating, normal practice is to sputter a copper seed layer of low resistivity, before electroplating copper to fill the recesses. This extra step obviously decreases throughput and adds to cost, because of the need to provide additional chambers or even additional sputtering systems for the copper seed layer Thus, from a further aspect, the applicants' invention consists in a method of electroplating copper onto a profiled surface of a semiconductor wafer or the like, including depositing a tantalum layer (typically required as a copper diffusion layer) onto the profiled surface and electroplating a copper layer directly onto the tantalum layer, wherein the tantalum layer has a resistivity of less than 50 micro.ohm.cm.

Preferably the tantalum barrier layer is at least substantially alpha phase tantalum.

The resistivity of the thin film layer (typically under 3000 Å thick but usually more than 50 Å thick) may be between 20 and 40 micro.ohm.cm and most particularly is about 25 micro.ohm.cm though the lower the resistivity the better. Bulk α phase tantalum resistivity is 13 micro.ohm.cm.

It will be appreciated that the tantalum layer can be deposited using the methods described above or in the following description.

Although the invention has been defined above, it is to be understood it includes any inventive combination of the features set out above or in the following description.

The invention may be performed in various ways and specific embodiments will now be described, by way of example, with reference to the accompanying drawings in which.

As has already been mentioned WO 01/01472 describes a method of depositing a low k insulating film.

Figure 3:
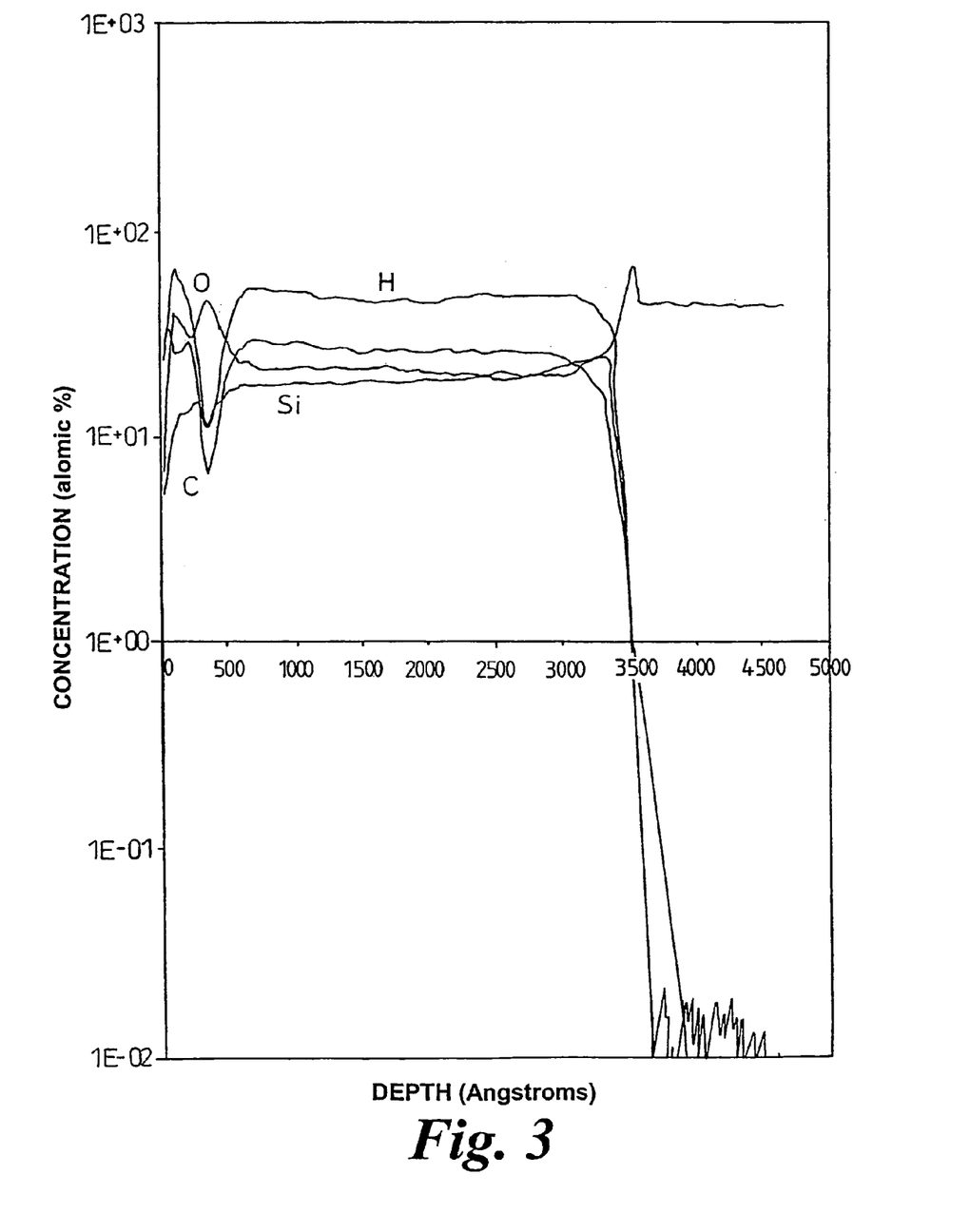
FIG. 3 is a Secondary Ion Mass Spectroscopy (SIMS) plot for a TMS+$O_2$ deposited film which has been set with a five minute hydrogen plasma.

As can be seen from FIG. 3, which is a SIMS diagram of such a film there is a top part, seen at between approximately 0–800 Å, which is chemically variable and distinct from the bulk of the film. In the experiments described below samples were prepared by depositing this insulating material onto respective substrates and then some of the samples had approximately 30 nm of this upper layer reactively plasma etched away using a $C_3F_8$ etch. For comparison purposes further samples were prepared on which a layer of thermal silicon dioxide was deposited instead of the low k film.

Ta was then deposited onto the samples under various process conditions and the resultant Ta film was analysed by x-ray defraction (XRD) to determine which phase of Ta had been deposited.

Figure 1:
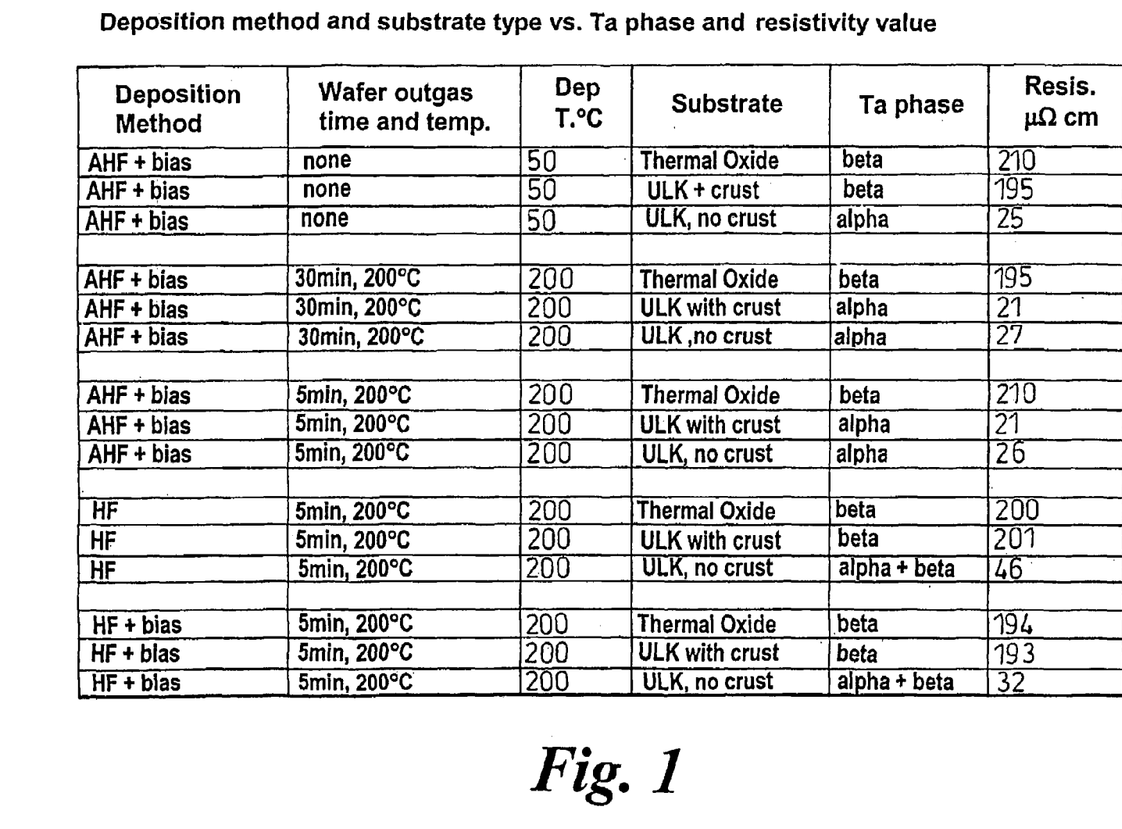
FIG. 1 is a summary of experimental detail.

The experimental set up was varied in a number of ways which are identified in FIG. 1, in accordance with the following key:

AHF: A source to substrate distance of 245 mm, tantalum target with a power of 5–25 kw d.c. applied, argon sputter gas at a pressure of 5 millitorr or less. Significant target material ionisation occurs in this process whereby a magnetically confined moving magnetron is used. This arrangement is described more fully in connection with FIG. 4.

HF: the same process conditions but without significant target material ionisation. Experiments have been carried out (not shown) that indicate that these longer source to substrate distances (standard for magnetron sputters is about 45 mm ) improve the results.

Bias: 13.56 meghz applied to the wafer platen to induce a dc voltage.

ULK: The film of WO 01/01472.

Crust: The uppermost 500 Å (=50 nm) of the low k film is present and forms the substrate surface upon which the tantalum has been magnetron sputtered.

No Crust: The uppermost surface has been reactively plasma etch removed with e.g. $C_3F_8$ or $CF_4$.

It will be noted that prior to sputtering, in a number of cases, the wafer was heated to 200° C. to encourage outgassing.

The chart of FIG. 1 summarise experiments performed using the following conditions:

AHF+Bias
13 kw DC target power
100 sccm of Argon
300 watts 13.56 Meg RF bias power to platen including a voltage of ~75v negative
Target magnetron confinement magnetic coil powered at 1,360 ampere turns
Process time 46 seconds for 150 nm deposition
Platen coils were powered at 320 ampere turns to improve uniformity.
HF
13 kw DC target power
100 sccm of Argon
No power applied to the substrate platen and no magnetic confinement of the target magnetron
Process time of 29 seconds for 140 nm deposition
HF & Bias
As HF with 100 watts of 13.56 meg RF bias power to the platen inducing a voltage of ~78v negative
Process time of 33 seconds for 150 nm deposition.

It will be noted, from FIG. 1, that under all conditions, when the crust of the ULK film was reactively etched away, the alpha phase predominated either in combination with the beta phase or to the exclusion of that phase. In all cases a significantly lower resistivity was achieved. It is postulated that this surprising selectivity of deposition is a result of the chemical make up of the underlying layer, which can be seen both from FIG. 4 and from the chemical composition given by Rutherford Back Scattering (RBS) as can be seen in the following table: Chemical composition by Rutherford Back Scattering (RBS)

| Depth | Hydrogen percent | Carbon percent | Oxygen percent | Silicon percent |
|---|---|---|---|---|
| <800Å | 32 | 17 | 33 | 18 |
| 800–1700Å | 42 | 16 | 25 | 17 |
| 1700–3500Å | 46 | 14 | 25 | 15 |

Thus where at least part of the crust is etched away, there is significantly more hydrogen present at the surface and/or it is more able to diffuse to the surface because of the at least partial removal of a dense upper layer and it is postulated that the hydrogen may be desorbed from the substrate and incorporated into the growing Ta film during the initial stages of film growth. This, it is conceived may cause the preferential deposition of the alpha phase. This could further explain why, when the insulating layer is heated preferential deposition of α-Ta takes place, because if the process is thermally activated, then the heat may compensate for the lower level of hydrogen in the crust.

By carefully adjusting the deposition parameters a mixture of both phases can be formed with an intermediate resistivity value, as shown in the chart.

It should also be noted from FIG. 1 that at a deposition temperature of 200° C. when the AHF+Bias process was run then an alpha phase tantalum of low resistivity was deposited upon the crust.

Figure 4:
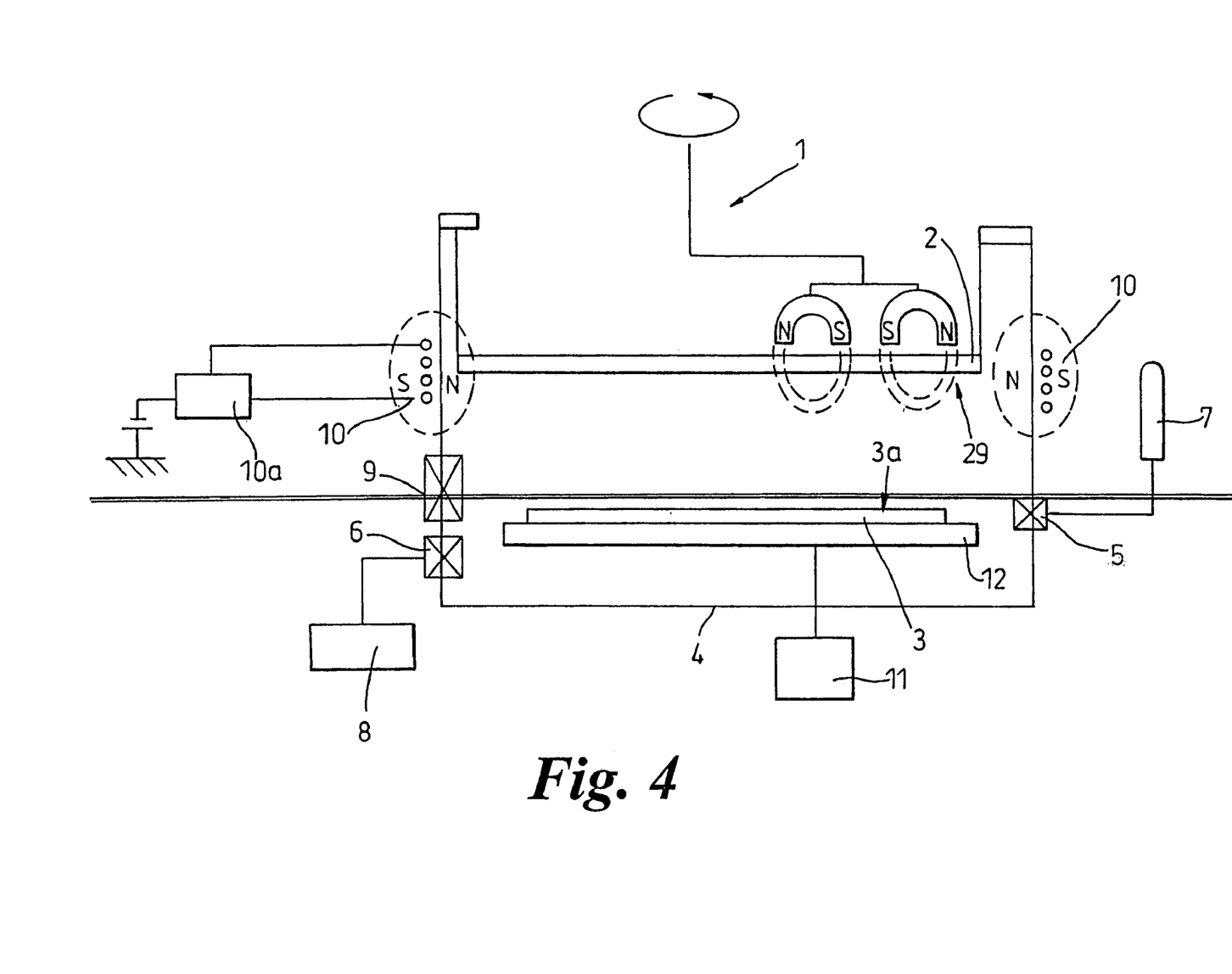
FIG. 4 is a schematic view of an AHF deposition chamber configuration.

An important difference between the AHF and HF processes is the energy level at the tantalum film during deposition. The unbalancing effect on the magnetron by the use of the coils 10 increases plasma ion flux (both sputter gas and metal) from an ion density of about 5 mAcm$^2$ to about 20 mAcm$^2$ and allows a significant part of the plasma to reach the substrate surface. This increasing energy level effectively substitutes for and avoids the need for the higher substrate temperatures of earlier disclosures. 200° C. is however considered to be too high a preferable temperature for a barrier deposition process and the focus of later experiments shown here was on processes of less than 100° C. that could reliably yield alpha phase tantalum.

Figure 2A:
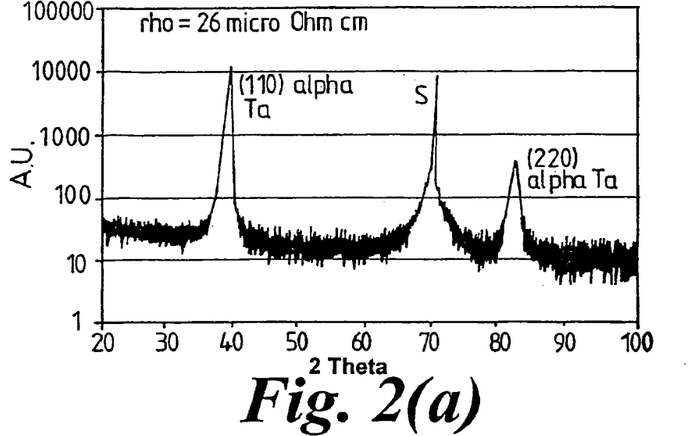
FIGS. 2a, b and c are respective x-ray defraction (XRD) patterns for certain of the films resulting from the described experiments.
Figure 2B:
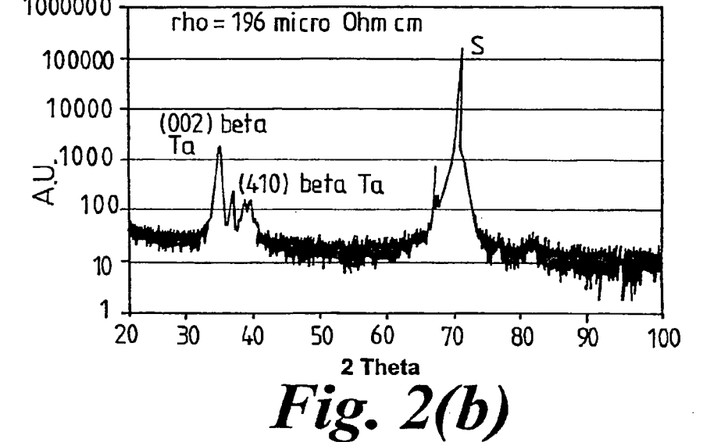
Figure 2C:
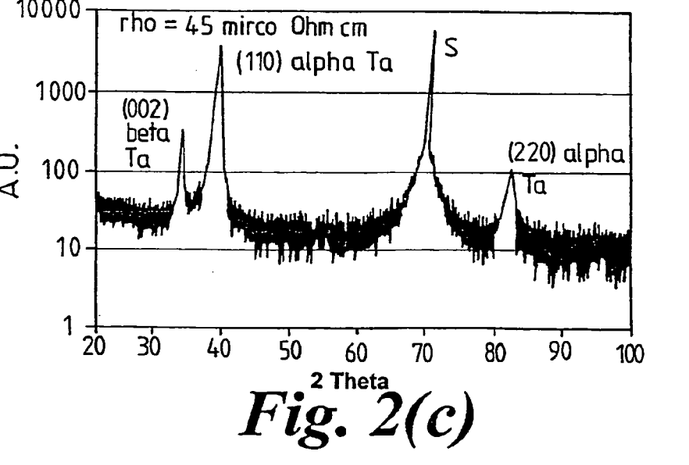

FIG. 2a shows the make up of a 100 nm thick Ta film deposited on the low-k insulating layer made in accordance with WO 01/01472 and it will be seen that there is significant deposition of α-Ta to the exclusion of β-Ta. FIG. 2b shows the corresponding results where the Ta film was deposited on the thermal silicon dioxide. FIG. 2c indicates the results where the deposition parameters have been adjusted so that both phases are deposited on the low-k dielectric.

It will also be noted from the table in FIG. 1 that the higher energy present in the growing sputtered film of the AHF apparatus appears to be more successful than the non ionised arrangement designated at "HF". This suggests that the high energy within a growing sputtered film can liberate a seeding agent from a seed layer without the use of high temperatures.

It is believed that, quite apart from the reduced resistivity, there is a further advantage in using α-Ta in that it promotes a (111) texture in a subsequently deposited copper seed layer. This is the preferred orientation for copper seed layers as it promotes (111) texture in the electroplated copper and this is believed to be more resistant to electromigration. Comparing intensities of (111) texture expressed as a ratio of peak intensity {111} over peak intensity {200} gives the following results:

$$\text{Copper seed deposited onto alpha tantalum} = \frac{I\{111\}}{I\{200\}} = 368$$

$$\text{Copper seed deposited onto beta tantalum} = \frac{I\{111\}}{I\{200\}} = 61$$

The AHF configuration is more particularly described in our International Application No. PCT/GB01/03229, the contents of which are incorporated herein by reference. For convenience a copy of FIG. 1 of that application is incorporated herein as FIG. 4. Briefly a moving magnetron 1 is provided above a target 2, which faces a platen 12 on which is mounted a substrate 3. An external coil 10 is provided in the vicinity of the periphery of the target 2 to alter the normal magnetic field applied by the moving magnetron 1. This coil 10 can be used to unbalance the magnetron and hence allow direct control of the ion-flux reaching the growing film, whereas a separate RF wafer-bias system 11 is used to control the energy of the impinging ions.

In the HF arrangement the coil 10 is either not present or is not energised.

Whilst these are the two sputtering arrangements so far experimented with they do not limit the generality of the invention. A single wafer sputtering system is particularly preferred whereby the wafer is not laterally moved during deposition. Any arrangement whereby there is a high level of energy provided to the tantalum film and/or the surface upon which it grows is included, where this energy does not take the bulk wafer temperature above about 250° C. and most preferably not above about 100° C.

Further analysis of the work reported in the table of FIG. 1 suggests that the fact that the AHF configuration was operated in an unbalanced magnetron mode, whilst the HF configuration was operated in a balance mode may be influential on the type of film deposited. Additionally or alternatively, the fact that the AHF is a long throw arrangement may also influence the type of film deposited. What is desirable is that there should be a high level of activation at the deposition surface.

Figure 5:
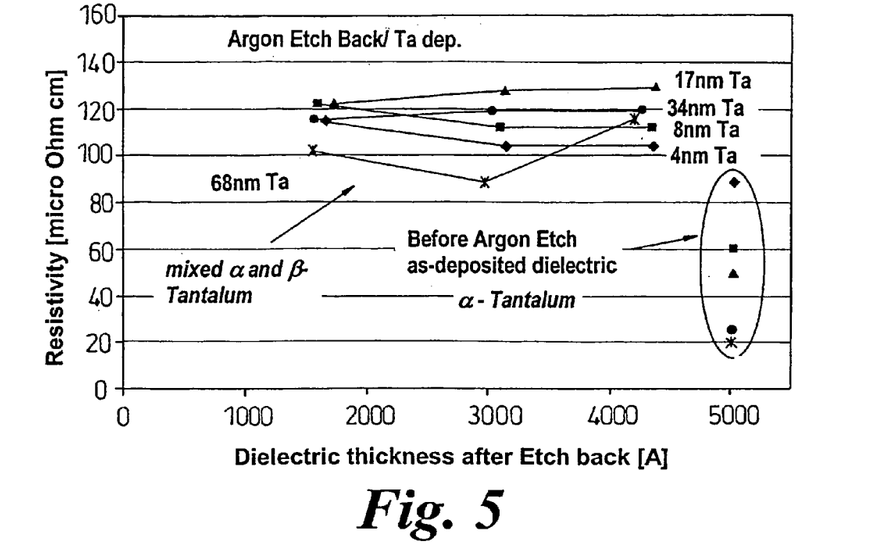
FIG. 5 is a graph of dielectric thickness against the resistivity of the tantalum layers showing the effect of an inert sputter etch.
Figure 6:
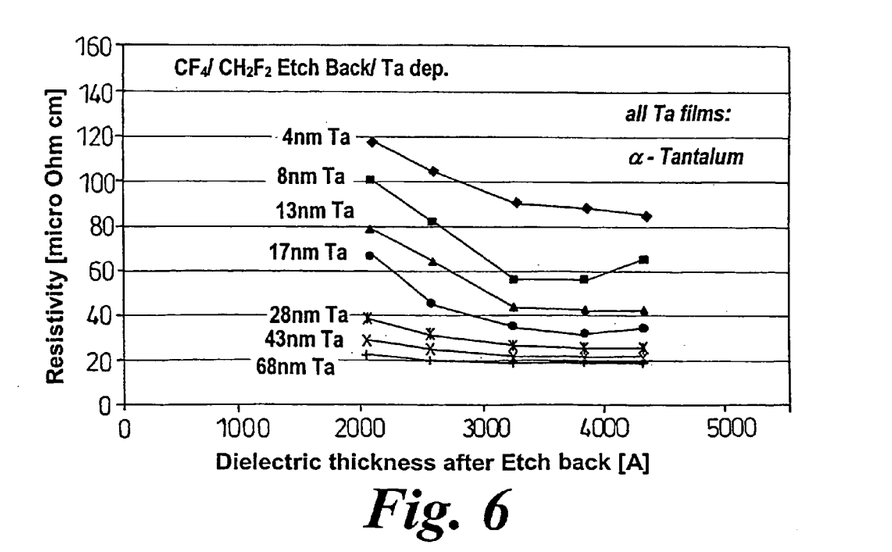
FIG. 6 corresponds to FIG. 5 for cases where the dielectric layer has been reactively etched back.

Subsequent experiments described in FIGS. 5 and 6 have been carried out broadly in accordance with the earlier AHF experiments at a source to substrate distance of 245 mm and a wafer platen temperature of 75° C.

Figure 7:
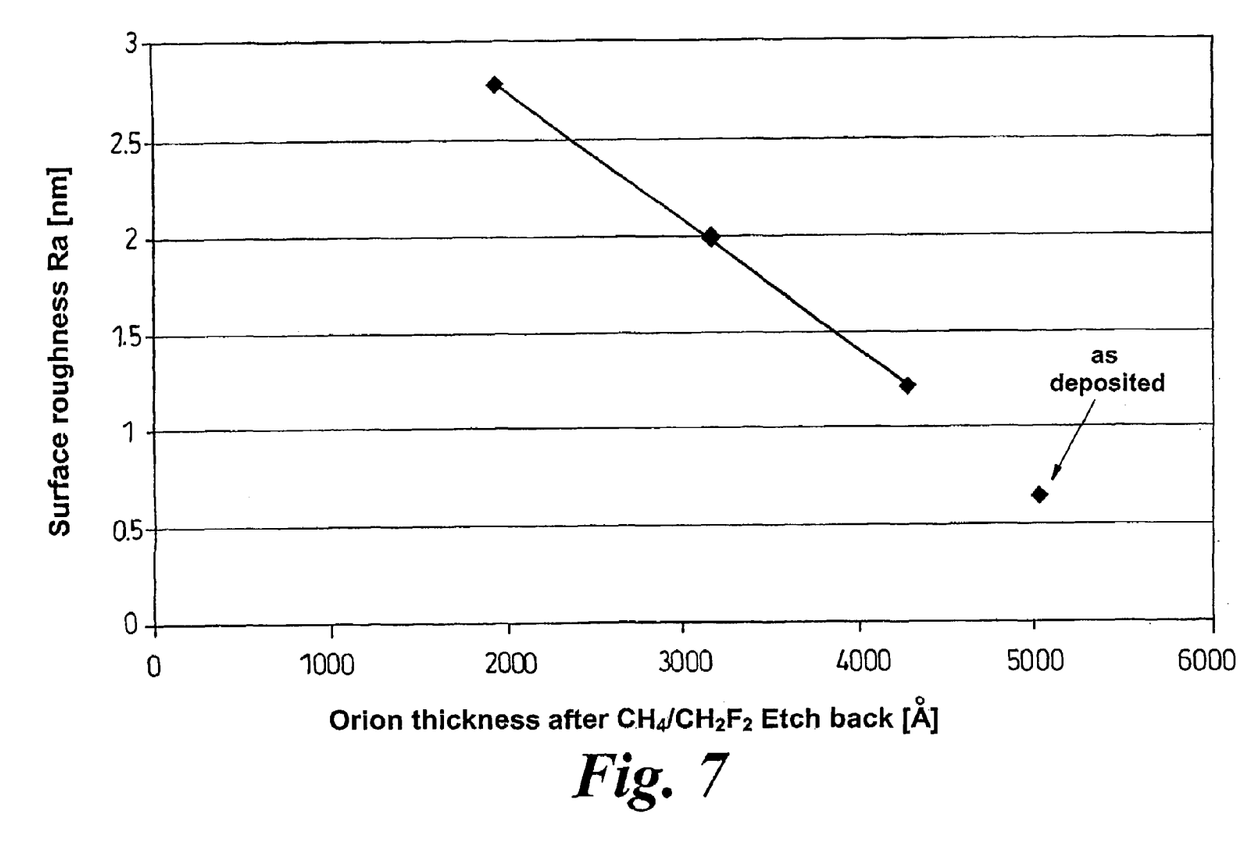
FIG. 7 shows the surface roughness resultant from the etching of FIG. 6.

These experiments were designed to investigate the well-known 'thin film' effect (particularly important for thin film barriers) and the effect of chemical compositional changes in the surface upon which the tantalum was sputtered. The low-k layer is known to have changes in composition as shown in FIG. 3 and additionally as the layer is etched back (as shown in FIG. 6) the resultant surface roughness increases as is shown in FIG. 7.

All the experiments shown in FIGS. 5 and 6 were carried out with a dielectric material as output from that deposition system. This system generally removes a surface layer by means of a $C_3F_8$ plasma etch for 30 seconds thereby removing at least some, but not necessarily all of an upper layer of the dielectric that from FIG. 3 is known to be of a different chemical composition. In FIG. 5 therefore the results labelled "Before Argon Etch, as-deposited dielectric" refer to the dielectric layer with at least some of the surface crust layer removed.

In FIG. 5, in addition to the 'thin film' effect can be seen the surprising result that an inert argon etch of the low-k dielectric both increases tantalum resistivity and shifts it from being always alpha to mixed alpha and beta. It is not yet known why this is happening, but is probably caused by a surface effect such as roughness or selective removal (by sputter etch) of components of the dielectric layer. Note however that the resistivity of the tantalum does not greatly change as the dielectric layer is etched.

By contrast reactive plasma etching of the low-k dielectric was carried out with $CF_4+CH_2F_2$, the results of which are shown at FIG. 6. It should be noted, by reference to FIG. 3, that this is an etching through a region of varying chemical compositions into the 'bulk' material and by reference to FIG. 7 is increasing surface roughness of the surface upon which the tantalum is to be deposited. In FIG. 6 it can be seen that a reactive $CF_4+CH_2F_2$ etch unlike the argon sputter etch does not promote beta tantalum. Rather there is always alpha phase tantalum, the resistivity being near bulk for the thickest film here, 68 nm. Also shown is that as the dielectric layer is etched into the resistivity of the subsequently deposited tantalum increases. This is particularly the case for the thinner films shown here where the increase in resistivity is of the order of 30%–50%. For 28 nm thicknesses and above the effect is much reduced and somewhat slight for the thickest film of 68 nm. It is known that the structure of the low-k dielectric layer is not homogeneous and this would indicate that for (in particular) very thin films the structure of the surface layer upon which the tantalum is sputtered is important to its morphology.

Whilst it is clear that the surface of the substrate plays a critical part in the morphology of the sputtered tantalum film it is not yet known what (relative) parts are played by structure or chemistry. The low-k dielectric film is of the SiCO:H type, that may be considered a hydrogenated carbon containing silicon dioxide. Carbon and/or hydrogen may be seeding the alpha phase and/or this seeding may be as a result of the microstructure of the surface of the dielectric. In addition there is fluorine present from the etch processes and this may also be playing some part.

Accordingly, the present invention includes a method of depositing Ta film in which alph-Ta dominates having a thickness of <300 nm comprising depositing a seed layer of a low dielectric constant insulating layer having carbon and/or hydrogen present in its near surface region or an appropriate microstructure in that region and physical vapour depositing tantalum onto the surface of the seed layer at a temperature below 250° C.

Preferably the tantalum film is no thicker than 30 nm and the deposition takes place at or below 100° C.

No subsequent anneal is required in order to achieve the low resistivity associated with alpha tantalum.

In a further preferred feature the physical vapour deposition process is sputtering most preferably a single wafer sputtering system where there is no lateral movement of the wafer during the deposition process. Preferably the process utilises a sputter chamber having an unbalanced magnetron. It is particularly preferred that the "unbalancing" is achieved using an electromagnetic coil whereby direct control of the ion flux to the substrate can be achieved, particularly with a view to achieving high actuation at the deposition surface. Other mechanisms for achieving such direct control may be equally applicable.

Whilst an ionised sputter system of an unbalanced magnetron type has been used for these experiments any ionised metal sputter system that achieves the necessary conditions to achieve the results shown here are included. Such systems include 'ion metal plasma', 'hollow cathode magnetron' and ionised PVD where in all cases a high degree of sputtered metal is ionised compared to standard sputtering systems.

For the sake of clarity it should be understood that the seed layer of this invention is not necessarily a separate layer. The seeding characteristics necessary for this invention may be carried out by a layer that also serves other useful purposes, such as a dielectric, barrier or etch stop layer within a damascene structure.

It should further be understood that references to 'insulating substrates' refers to the characteristics relevant to this patent, being an insulating surface upon which the tantalum is deposited.

The invention claimed is:

1. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C., wherein the seed layer is a methyl-doped silicon oxide.

2. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the seed layer is formed by reacting a silicon containing organic compound and an oxidising agent in the presence of a plasma and setting the resultant film such that the carbon containing groups are contained therein.

3. A method as claimed in claim 2 wherein the seed layer is set by exposing it to an hydrogen containing plasma.

4. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the surface of the seed layer has been etched away prior to tantalum deposition.

5. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the seed layer is heated prior to tantalum deposition.

6. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the tantalum source to substrate separation is at least 200 mm.

7. A method as claimed in claim 6 wherein the tantalum source to substrate distance is between 200 mm and 250 mm.

8. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the tantalum deposition is by unbalanced magnetron sputtering.

9. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the substrate is biased.

10. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein copper is deposited on the Ta film.

11. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein the seed layer is an inter metal dielectric layer.

12. A method of depositing Ta film in which α-Ta dominates having a thickness <300 nm comprising depositing a seed layer of an organic-containing low dielectric constant insulating layer and sputtering Tantalum to deposit a-Ta onto the seed layer at a temperature below 250° C. wherein a significant proportion of the tantalum material arrives at the seed layer in an ionised state.

* * * * *